(12) United States Patent
Park et al.

(10) Patent No.: US 8,031,027 B2
(45) Date of Patent: Oct. 4, 2011

(54) VOLTAGE-CONTROLLED OSCILLATOR, PHASE-LOCKED LOOP (PLL) CIRCUIT, AND CLOCK GENERATOR

(75) Inventors: Jae-Hyun Park, Seoul (KR); Jong-Shin Shin, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 97 days.

(21) Appl. No.: 12/479,132

(22) Filed: Jun. 5, 2009

(65) Prior Publication Data

US 2010/0052746 A1    Mar. 4, 2010

(30) Foreign Application Priority Data

Aug. 29, 2008   (KR) .................. 10-2008-0085031

(51) Int. Cl.
*H03L 1/00*       (2006.01)
*H03L 7/085*      (2006.01)
*H03K 3/03*       (2006.01)
(52) U.S. Cl. ............... 331/186; 331/8; 331/17; 331/34; 331/57; 327/158
(58) Field of Classification Search ............ 331/8, 16, 331/17, 34, 45, 57, 108 R, 177 R, 185, 186; 327/156–158; 375/374–376
See application file for complete search history.

(56) References Cited

U.S. PATENT DOCUMENTS

| 5,668,505 | A  |   | 9/1997  | Vu et al. |
| 5,949,289 | A  | * | 9/1999  | Smith et al. ................. 331/8 |
| 6,084,483 | A  | * | 7/2000  | Keshtbod ................. 331/57 |
| 6,316,987 | B1 | * | 11/2001 | Dally et al. ................. 327/538 |
| 6,351,191 | B1 | * | 2/2002  | Nair et al. ................. 331/57 |
| 6,452,458 | B1 |   | 9/2002  | Tanimoto |
| 6,977,558 | B2 | * | 12/2005 | Cranford et al. ........... 331/186 |
| 7,436,229 | B2 | * | 10/2008 | Sidiropoulos et al. ....... 327/157 |
| 7,602,260 | B1 | * | 10/2009 | Atesoglu ................. 331/186 |
| 7,688,150 | B2 | * | 3/2010  | Kurd et al. ................. 331/44 |
| 7,804,341 | B2 | * | 9/2010  | Bazes ................. 327/156 |

FOREIGN PATENT DOCUMENTS

| JP | 9-275332   | 10/1997 |
| JP | 10-22794   | 1/1998  |
| JP | 10-135791  | 5/1998  |
| JP | 2000-315939 | 11/2000 |

* cited by examiner

*Primary Examiner* — Levi Gannon

(74) *Attorney, Agent, or Firm* — Mills & Onello, LLP

(57) ABSTRACT

A voltage-controlled oscillator includes a voltage regulator, and a delay unit. The voltage regulator independently receives a first oscillation control signal and a second oscillation control signal to provide a regulated voltage signal which is represented by a regular ratio of combination of the first and second oscillation control signals, and the regulated voltage signal is feedback to the voltage regulator. The delay unit generates an output signal having a frequency varying in response to the regulated voltage signal.

14 Claims, 12 Drawing Sheets

BLENDED EDGE

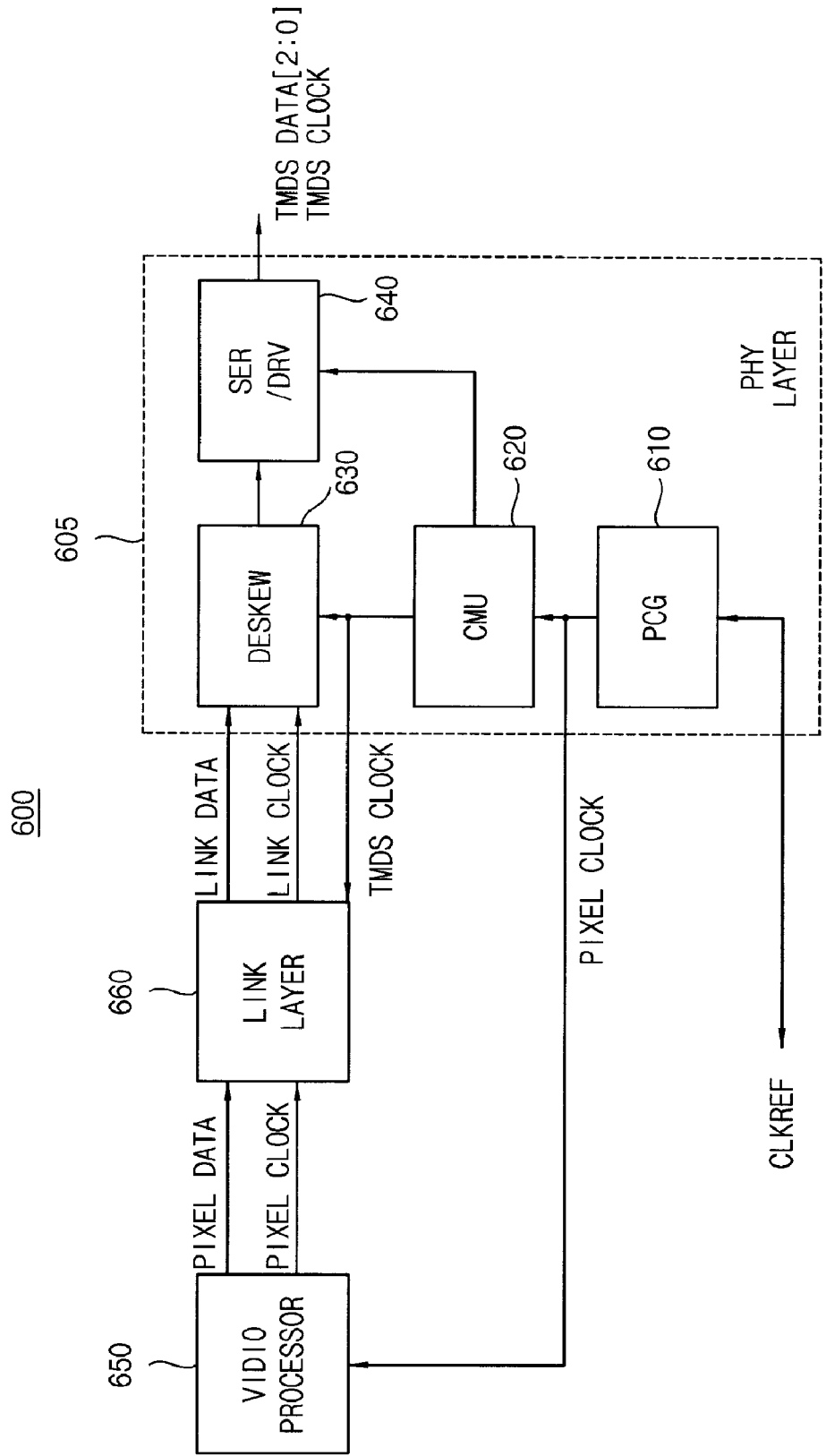

VOLTAGE-CONTROLLED OSCILLATOR, PHASE-LOCKED LOOP (PLL) CIRCUIT, AND CLOCK GENERATOR

RELATED APPLICATION

This application claims priority under 35 U.S.C. 119 to Korean Patent Application number 10-2008-0085031, filed on Aug. 29, 2008 in the Korean Intellectual Property Office, the entire contents of which are incorporated herein by reference.

BACKGROUND

1. Technical Field

Example embodiments relate to a multi-media system, and more particularly to a clock generator used in the multi-media system.

2. Description of the Related Art

Recently, the required operating speed of a multi-media system (hereinafter "system") has increased dramatically. As a result, required data processing speed has also greatly increased to accommodate the increase in system operating speed. Clock signals having high frequency are required to increase the operating speed of the system.

As a feature size used during the manufacturing process of the clock generator decreases, a voltage level of the supply voltage decreases, and thus, a gain of a voltage-controlled oscillator (VCO) increases. When the gain of the VCO increases, a jitter characteristic of the VCO is degraded.

SUMMARY

Example embodiments provide a voltage-controlled oscillator (VCO) capable of enhancing a jitter characteristic.

Example embodiments provide a phase-locked loop (PLL) circuit including the VCO.

Example embodiments provide a clock generator including the PLL circuit.

Example embodiments provide a high-definition media interface (HDMI) transmitter (TX) physical layer (PHY) including the clock generator.

According to some example embodiments, a VCO includes a voltage regulator and a delay unit. The voltage regulator independently receives a first oscillation control signal and a second oscillation control signal to provide a regulated voltage signal which is represented by a regular ratio of combination of the first and second oscillation control signals, and the regulated voltage signal is fed back to the voltage regulator. The delay unit generates an output signal having a frequency varying in response to the regulated voltage signal.

In some embodiments, the voltage regulator may include an amplifier that provides a voltage control signal in response to the first oscillation control signal, the second oscillation control signal, and the regulated voltage signal. A transistor is coupled to a power supply voltage and provides the regulated voltage signal in response to the voltage control signal.

In some embodiments, the amplifier may include a current mirror unit, coupled to the power supply voltage, which includes a first PMOS transistor and a second PMOS transistor; a first input unit, coupled to the current mirror unit at first and second nodes, configured to receive the first oscillation control signal, the regulated voltage signal and a bias voltage to control a first contribution factor of the first oscillation control signal with respect to the regulated voltage signal; and a second input unit, coupled to the current mirror unit at the first and second nodes, which receives the second oscillation control signal, the regulated voltage signal and the bias voltage to control a second contribution factor of the second oscillation control signal with respect to the regulated voltage signal, the voltage control signal being provided at the first node.

The first input unit may include a first NMOS transistor having a drain coupled to the first node, and a gate which receives the first oscillation control signal; a second NMOS transistor having a drain coupled to the second node, and a gate which receives the regulated voltage; and a first current source including a third NMOS transistor, commonly coupled to sources of the first and second NMOS transistors at a first common node, which provides a first bias current of a first magnitude to the first common node in response to the bias voltage applied to a gate of the third NMOS transistor. The second input unit may include a fourth NMOS transistor having a drain coupled to the first node, and a gate which receives the second oscillation control signal; a fifth NMOS transistor having a drain coupled to the second node, and a gate which receives the regulated voltage; and a second current source including a sixth NMOS transistor, commonly coupled to sources of the fourth and fifth NMOS transistors at a second common node, which provides a second bias current of a second magnitude to the second common node in response to the bias voltage applied to a gate of the sixth NMOS transistor.

The first magnitude of the first bias current and the second magnitude of the second bias current may be respectively determined based on respective sizes if the third and sixth NMOS transistors.

The first contribution factor may be determined based on sizes of the first and second NMOS transistors, and the second contribution factor may be determined based on sizes of the fourth and fifth NMOS transistors.

The first contribution factor may be determined based on sizes of the first, second and third NMOS transistors, and the second contribution factor may be determined based on sizes of the fourth, fifth and sixth NMOS transistors.

According to some example embodiments, a PLL circuit includes a phase/frequency detector, a first signal path, a second signal path, and a VCO. The phase/frequency detector generates an up/down signal based on an input signal and an output signal. The first signal path provides a first oscillation control signal proportional to the up/down signal. The second signal path provides a second oscillation control signal represented by an integral function of the up/down signal. The VCO independently receives a first oscillation control signal and a second oscillation control signal to generate the output signal having a varying frequency in response to a regulated voltage signal which is represented by a regular ratio of combination of the first and second oscillation control signals.

In some embodiments, the first signal path may include a first charge pump that generates a first voltage signal varying in response to the up/down signal, and a first loop filter that filters the first voltage signal to provide the first oscillation control signal, and the second signal path may include a second charge pump that generates a second voltage signal varying in response to the up/down signal, and a second loop filter that filters the second voltage signal to provide the second oscillation control signal.

In some embodiments, the PLL circuit may further include a buffer, coupled between the first loop filter and the second loop filter, which maintains DC voltage levels of the first and second oscillation control signals.

In some embodiments, the VCO may include a voltage regulator which independently receives the first oscillation control signal and the second oscillation control signal to provide the regulated voltage signal, the regulated voltage signal being fed back to the voltage regulator, and a delay unit which generates the output signal in response to the regulated voltage signal.

The voltage regulator may include an amplifier that provides a voltage control signal in response to the first oscillation control signal, the second oscillation control signal, and the regulated voltage signal; and a transistor, coupled to a power supply voltage, configured to provide the regulated voltage signal in response to the voltage control signal.

The amplifier may include a current mirror unit, coupled to the power supply voltage, which includes a first PMOS transistor and a second PMOS transistor; a first input unit, coupled to the current mirror unit at first and second nodes, which receives the first oscillation control signal, the regulated voltage signal and a bias voltage to control a first contribution factor of the first oscillation control signal with respect to the regulated voltage signal; and a second input unit, coupled to the current mirror unit at the first and second nodes, which receives the second oscillation control signal, the regulated voltage signal and the bias voltage to control a second contribution factor of the second oscillation control signal with respect to the regulated voltage signal, the voltage control signal being provided at the first node.

The first input unit may include a first NMOS transistor having a drain coupled to the first node, and a gate which receives the first oscillation control signal; a second NMOS transistor having a drain coupled to the second node, and a gate which receives the regulated voltage; and a first current source including a third NMOS transistor, commonly coupled to sources of the first and second NMOS transistors at a first common node, which provides a first bias current of a first magnitude to the first common node in response to the bias voltage applied to a gate of the third NMOS transistor. The second input unit may include a fourth NMOS transistor having a drain coupled to the first node, and a gate which receives the second oscillation control signal; a fifth NMOS transistor having a drain coupled to the second node, and a gate which receives the regulated voltage; and a second current source including a sixth NMOS transistor, commonly coupled to sources of the fourth and fifth NMOS transistors at a second common node, which provides a second bias current of a second magnitude to the second common node in response to the bias voltage applied to a gate of the sixth NMOS transistor.

The first contribution factor may be determined based on the first magnitude of the first bias current and the second contribution factor may be determined based on the second magnitude of the second bias current.

The first contribution factor may be determined based on sizes of the first and second NMOS transistors, and the second contribution factor may be determined based on sizes of the fourth and fifth NMOS transistors.

The first contribution factor may be determined based on sizes of the first, second and third NMOS transistors, and the second contribution factor may be determined based on sizes of the fourth, fifth and sixth NMOS transistors.

When the first and second NMOS transistors have same sizes substantially corresponding to W0, each of the fourth and fifth NMOS transistors may have size substantially corresponding to N*W0 (N is a natural number more than one), and when the third NMOS transistor has a size substantially corresponding to W1, the sixth NMOS transistor may have a size substantially corresponding to N*W1.

A relationship of the first oscillation control signal VCP, the second oscillation control signal VCI and the regulated voltage signal VERG is represented by: VREG=VCP*1/(N+1)+VCI*N/(N+1).

In some embodiments, the first input unit may include a first plurality of NMOS transistors, each having a drain coupled to the first node, and a gate which receives the first oscillation control signal, a second plurality of NMOS transistors, each having a drain coupled to the second node, and a gate which receives the regulated voltage, and a third plurality of NMOS transistors, each commonly coupled to sources of the first and second NMOS transistors at each of first common nodes, which selectively provide a first plurality of bias currents to each of the first common nodes in response to the bias voltage applied to each of the third NMOS transistors, the first bias currents having first magnitudes increasing proportionally with respect to one another. The second input unit may include a fourth NMOS transistor having a drain coupled to the first node, and a gate which receives the second oscillation control signal, a a fifth NMOS transistor having a drain coupled to the second node, and a gate which receives the regulated voltage, and a second current source including a sixth NMOS transistor, commonly coupled to sources of the fourth and fifth NMOS transistors at a second common node, which provides a second bias current of a second magnitude to the second common node in response to the bias voltage applied to a gate of the sixth NMOS transistor.

The first NMOS transistors may have sizes increasing in the same proportion as the magnitudes of the first bias currents, the second NMOS transistors may have sizes increasing in the same proportion as the magnitudes of the first bias currents, the third NMOS transistors have sizes increasing in the same proportion as the magnitudes of the first bias currents, and the first NMOS transistors and the second NMOS transistors coupled to each of the first common nodes, may have substantially same sizes by the transistors coupled to each of the first common nodes.

In some embodiments, the first input may include a first NMOS transistor having a drain coupled to the first node, and a gate which receives the first oscillation control signal, a second NMOS transistor having a drain coupled to the second node, and a gate which receives the regulated voltage, and a first current source including a third NMOS transistor, commonly coupled to sources of the first and second NMOS transistors at a first common node, which provides a first bias current of a first magnitude to the first common node in response to the bias voltage applied to a gate of the third NMOS transistor. The second input unit may include a fourth plurality of NMOS transistors, each having a drain coupled to the first node, and a gate which receives the second oscillation control signal, a a fifth plurality of NMOS transistor, each having a drain coupled to the second node, and a gate which receives the regulated voltage, and a sixth plurality of NMOS transistor, each commonly coupled to sources of the fourth and fifth NMOS transistors at each of second common nodes, which selectively provide a second plurality of bias currents to each of the second common node in response to the bias voltage applied to each of the sixth NMOS transistors, the second bias currents having second magnitudes increasing proportionally with respect to one another.

According to other example embodiments, a PLL includes a VCO, a phase/frequency detector, a first signal path, a second signal path and a control unit. The VCO performs a coarse tuning in response to a first oscillation control signal based on a digital control signal in a first operation mode, and performs a fine tuning in response to a second oscillation control signal and a third oscillation control signal in a second operation mode to generate an output signal following a reference signal. The phase/frequency detector generates an up/down signal based on the input signal and the output signal. The first signal path provides the first oscillation control signal proportional to the up/down signal. The second signal path provides the second oscillation control signal represented by an integral function of the up/down signal. The control unit provides the first oscillation control signal.

In some embodiments, the control unit may include a calibration logic circuit that provides the digital control signal having bits according to a target frequency of the output signal, and a digital to analog converter that converts the digital control signal to provide the first oscillation control signal.

In some embodiments, the VCO may include a voltage regulator which generates a regulated voltage signal based on the first oscillation control signal in the first operation mode and based on the second and third oscillation control signals in the second operation mode, the regulated voltage signal following the first oscillation control signal in the first operation mode, the regulated voltage signal being represented by a regular ratio of combination of the second and third oscillation control signals in the second operation mode, the regulated voltage signal being feedback to the voltage regulator, and a delay unit which generates the output signal having a frequency varying in response to the regulated voltage signal.

The voltage regulator may include an amplifier that provides a voltage control signal based on the first oscillation control signal in the first operation mode, and based on the second oscillation control signal, the third oscillation control signal and the regulated voltage signal in the second operation mode; and a transistor, coupled to a power supply voltage, which provides the regulated voltage signal in response to the voltage control signal.

The amplifier may include a current mirror unit, coupled to the power supply voltage, which includes a first PMOS transistor and a second PMOS transistor; a first input unit, coupled to the current mirror unit at first and second nodes, configured to receive the first oscillation control signal, the regulated voltage signal and a bias voltage to provide the first the voltage control signal in the first operation mode; a second input unit, coupled to the first and second mirror unit at the first and second nodes, configured to receive the second oscillation control signal, the regulated voltage signal and a bias voltage to control a first contribution factor of the second oscillation control signal with respect to the regulated voltage signal; and a third input unit, coupled to the current mirror unit at the first and second nodes, configured to receive the third oscillation control signal, the regulated voltage signal and the bias voltage to control a second contribution factor of the third oscillation control signal with respect to the regulated voltage signal, the voltage control signal being provided at the first node.

According to other example embodiments, a clock generator may include a PLL, a selection unit, a frequency dividing unit, and a sigma-delta modulator (SDM). The PLL generates a plurality of output signals having fixed phase differences from a reference signal. The selection unit selects and outputs one of the output signals in response to a plurality of selection signals, and prevents simultaneous transitions of at least two adjacent selection signals of the plurality of selection signals. The frequency dividing unit provides a first feedback signal to the PLL by dividing a frequency of the selected output signal. The SDM operates in synchronization with a second feedback signal, and generates the selection signals in response to a control signal, the second feedback signal having a frequency which is R times a frequency of the reference signal, R being a natural number.

The selection unit may include a blending multiplexer that prevent simultaneous transitions of the selection signals and the output signals by using a half Schmitt Trigger circuit and an inverter.

The first feedback signal may be obtained by dividing a frequency of the selection signal by K which is an integer greater than R.

The frequency dividing unit may include a first frequency divider that divides a frequency of the selected output signal by L which is an integer, and a second frequency divider that divides a frequency of an output signal of the first divider by K, and K may be a product of R and M, and the second feedback signal is output from the first frequency divider.

The PLL may include a phase/frequency detector that generates an up/down signal based on a phase difference between the reference signal and the first feedback signal; a first signal path that provides a first oscillation control signal proportional to the up/down signal, the first signal path including a first charge pump and a first loop filter; a second signal path that provides a second oscillation control signal represented by an integral function of the up/down signal, the second signal path including a second charge pump and a second loop filter; and a VCO independently which receives the first oscillation control signal and the second oscillation control signal to generate the plurality of output signals in response to a regulated voltage signal which is represented by a regular ratio of combination of the first and second oscillation control signals.

According to some example embodiments, a HDMI TX PHY includes a pixel clock generator, a clock multiplication unit (CMU), an alignment unit and a serializer/driver. The pixel clock generator generates a pixel clock signal based on a reference clock signal. The CMU multiplies the pixel clock signal to provide a transition minimized differential signaling (TMDS) clock signal. The alignment unit receives link data in synchronization with a link clock signal to align the received link data in synchronization with a TMDS clock signal, the link data being encoded and packetized from pixel data, the link clock signal having a frequency not lower than a frequency of the TMDS clock signal. The serializer/driver receives the TMDS clock signal, and serializes the aliened link data to provide TMDS data and the TMDS clock signal.

In some embodiments, the pixel clock generator may include a PLL which generates a plurality of output signals having fixed phase differences from the reference signal; a selection unit which selects one of the output signals and provides the pixel clock signal in response to a plurality of selection signals, and prevents simultaneous transitions of at least two adjacent selection signals of the plurality of selection signals; a frequency dividing unit provides a first feedback signal to the PLL by dividing a frequency of the pixel clock signal; and a SDM operates in synchronization with a second feedback signal, and generates the selection signals in response to a control signal, the second feedback signal having a frequency which is R times a frequency of the reference signal, R being a natural number.

In some embodiments, the CMU may include a PLL which generates a plurality of output signals having fixed phase differences from the reference signal; a selection unit which selects one of the output signals and provides the pixel clock signal in response to a plurality of selection signals, and prevents simultaneous transitions of at least two adjacent selection signals of the plurality of selection signals; and a frequency dividing unit which provides a feedback signal to the PLL by dividing a frequency of the pixel clock signal.

According to some example embodiments, in the PLL, the jitter characteristic of the VCO may be enhanced by individually controlling the gain of the VCO by at least two oscillation control signals from different paths. In addition, in the HDMI TX PHY employing the PLL, the jitter characteristic may be enhanced, and the missing edge of the clock signals may be prevented because the clock generator employs the blending multiplexer.

BRIEF DESCRIPTION OF THE DRAWINGS

The foregoing and other features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 12 is a block diagram illustrating a system on chip (SoC) including a HDMI transmitter (TX) physical layer (PHY), according to some example embodiments.

DETAILED DESCRIPTION OF THE EMBODIMENTS

Figure 1:
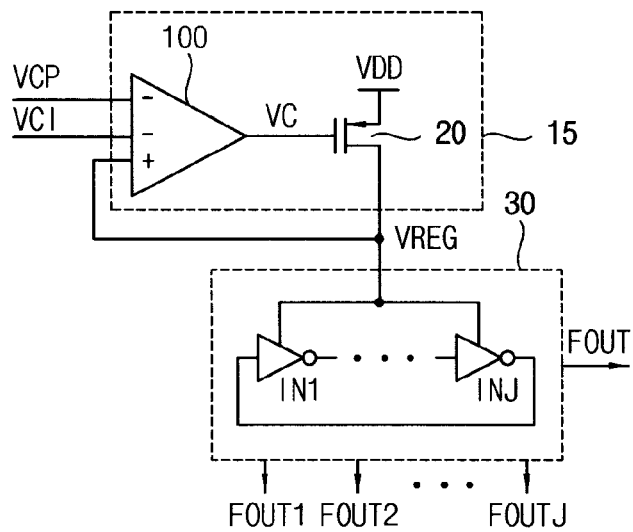
FIG. 1 is a circuit diagram illustrating a voltage-controlled oscillator (VCO), according to some example embodiments.

This application claims priority under 35 USC §119 to Korean Patent Application No. 2008-0085031, filed on Aug. 29, 2008 in the Korean Intellectual Property Office (KIPO), the contents of which are herein incorporated by reference in their entirety.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this description will be thorough and complete, and will fully convey the scope of the present invention to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a circuit diagram illustrating a voltage-controlled oscillator (VCO) according to some example embodiments, Referring to FIG. 1, a VCO 10 according to some example embodiments includes a voltage regulator 15 and a delay unit 30. The voltage regulator includes an amplifier 100 and a transistor 20.

The voltage regulator 15 independently receives a first oscillation control signal VCP and a second oscillation control signal VCI to provide a regulated voltage signal VREG, and the regulated voltage signal VREG is fed back to the voltage regulator 15. The regulated voltage signal VREG is represented by a regular ratio of a combination of the first and second oscillation control signals VCP and VCI.

The amplifier 100 receives the first oscillation control signal VCP, the second oscillation control signal VCI and the fed back regulated voltage signal VREG to provide a voltage control signal VC to the gate of the transistor 20. The transistor 20 is coupled to a power supply voltage VDD, and provides the regulated voltage signal VREG to the delay unit 30 in response to the voltage control signal VC.

The delay unit 30 receives the regulated voltage signal VREG to generate an output signal FOUT having a frequency varying according to a voltage level of the regulated voltage signal VREG. The delay unit may include a plurality of inverters IN1~INJ. When the output signal FOUT is generated from the inverters IN1~INJ, the output signal FOUT may be multi-phase output signals FOUT1~FOUTJ having fixed phase differences, for example multi-phase clock signals.

Figure 2:
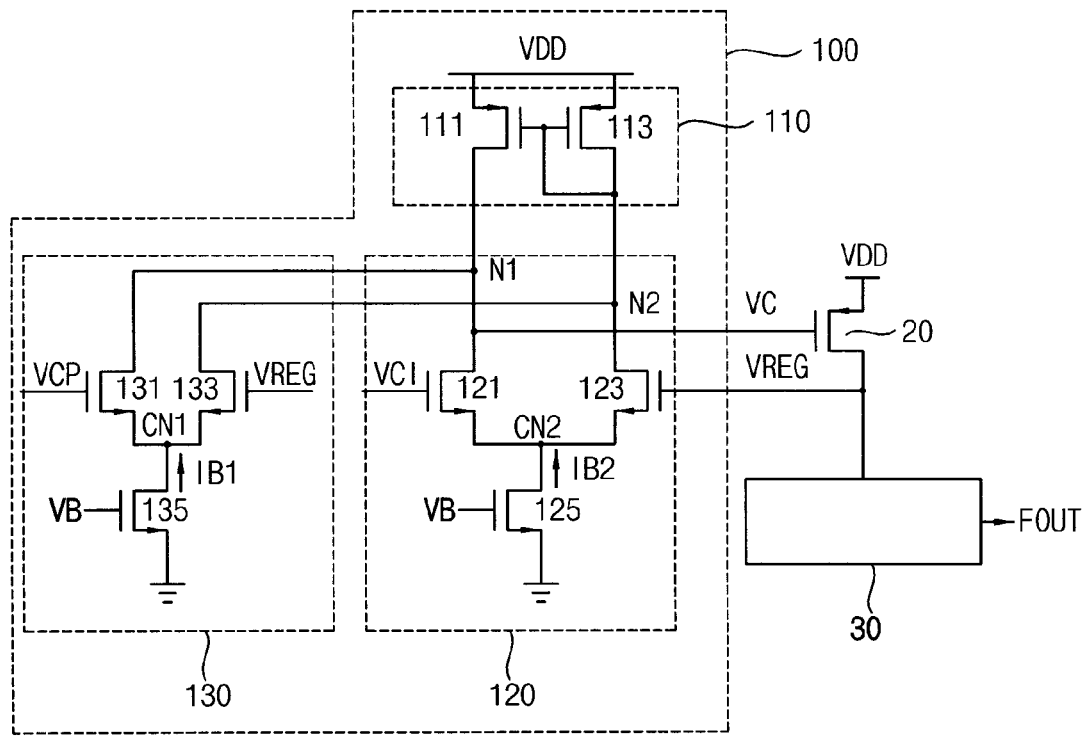
FIG. 2 is a circuit diagram illustrating the amplifier of FIG. 1 in detail, according to some example embodiments.

FIG. 2 is a circuit diagram illustrating the amplifier of FIG. 1 in detail according to some example embodiments.

Referring to FIG. 2, the amplifier 100 includes a current mirror unit 110, a first input unit 130, and a second input unit 120.

The current mirror unit 110 includes p-type metal oxide semiconductor (PMOS) transistors 111 and 113 coupled to the power supply voltage VDD. The PMOS transistors 111 and 113 are coupled to each other in a mirror configuration.

The first input unit 130 is coupled to the current mirror unit 110 at first and second nodes N1 and N2, and includes first through third NMOS transistors 131, 133, and 135. The first n-type metal oxide semiconductor (NMOS) transistor 131 has a drain coupled to the first node N1, and a gate receiving the first oscillation control signal VCP. The second NMOS transistor 133 has a drain coupled to the second node N2, and a gate receiving the regulated voltage signal VREG. The third NMOS transistor 135 has a drain commonly coupled to sources of the first and second NMOS transistors 131 and 133 at a first common node CN1, a gate receiving a bias voltage VB to provide a first bias current IB1 to the first common node CN1, and a source coupled to ground. The third NMOS transistor 135 operates as a first current source, and a magnitude of the first bias current IB1 is determined based on a size of the third NMOS transistor 135, i.e., a ratio of channel width to channel length of the third NMOS transistor 135.

The second input unit 120 is coupled to the current mirror unit 110 at the first and second nodes N1 and N2, and includes fourth through sixth NMOS transistors 121, 123, and 125. The fourth NMOS transistor 121 has a drain coupled to the first node N1, and a gate receiving the second oscillation control signal VCI. The fifth NMOS transistor 123 has a drain coupled to the second node N2, and a gate receiving the regulated voltage signal VREG. The sixth NMOS transistor 125 has a drain commonly coupled to sources of the fourth and fifth NMOS transistors 121 and 123 at a second common node CN2, a gate receiving the bias voltage VB to provide a second bias current IB2 to the second common node CN2, and a source coupled to ground. The sixth NMOS transistor 125 operates as a second current source, and a magnitude of the second bias current IB2 is determined based on a size of the sixth NMOS transistor 125, i.e., a ratio of channel width to channel length of the sixth NMOS transistor 125.

The regulated voltage signal VREG is represented by a regular ratio of a combination of the first and second oscillation control signals VCP and VCI. Hereinafter, a contribution factor of the first oscillation control signal VCP with respect to the regulated voltage signal VREG will be referred to as a first contribution factor, and a contribution factor of the second oscillation control signal VCI with respect to the regulated voltage signal VREG will be referred to as a second contribution factor. The first contribution factor and the second contribution factor may be controlled in various ways.

For example, when a size of the third NMOS transistor 135, i.e., the first current source, is substantially set to Wn0, a size of the sixth NMOS transistor 125, i.e., the second current source, is substantially set to N*Wn0 is a natural number not less than one. Then, a ratio of the first and second contribution factors corresponds to 1:N. Therefore, the first and second contribution factors may be controlled by setting the sizes of the third and sixth NMOS transistors 135, and 125.

The ratio of the first contribution factor and the second contribution factor may be controlled by setting sizes of the first and second NMOS transistors 131 and 133 and the fourth and fifth NMOS transistors 121 and 133 in addition to setting the sizes of the third and sixth NMOS transistors 135 and 125. When sizes of the first and second NMOS transistors 131 and 133 are set to Wn1, sizes of the fourth and fifth NMOS transistors 121 and 123 are set to N*Wn1 the ratio of the first and second contribution factors corresponds to 1:N.

The relationship of the first oscillation control signal VCP, the second oscillation control signal VCI and the regulated control signal VREG is represented by [Equation 1] below.

$$VREG = VCP*1/(N+1) + VCI*N/(N+1) \qquad \text{Equation 1}$$

The first contribution factor of the first oscillation control signal VCP and the second contribution factor of the second oscillation control signal VCI represented in the regulated voltage signal VREG may be controlled by controlling a size ratio of the third and sixth NMOS transistors 135 and 125 or by controlling size ratio of the transistors included in the first input unit 130 to the transistors included in the second input unit 120.

The VCO of FIGS. 1 and 2 may be employed in a phase-locked loop (PLL) circuit.

Figure 3:
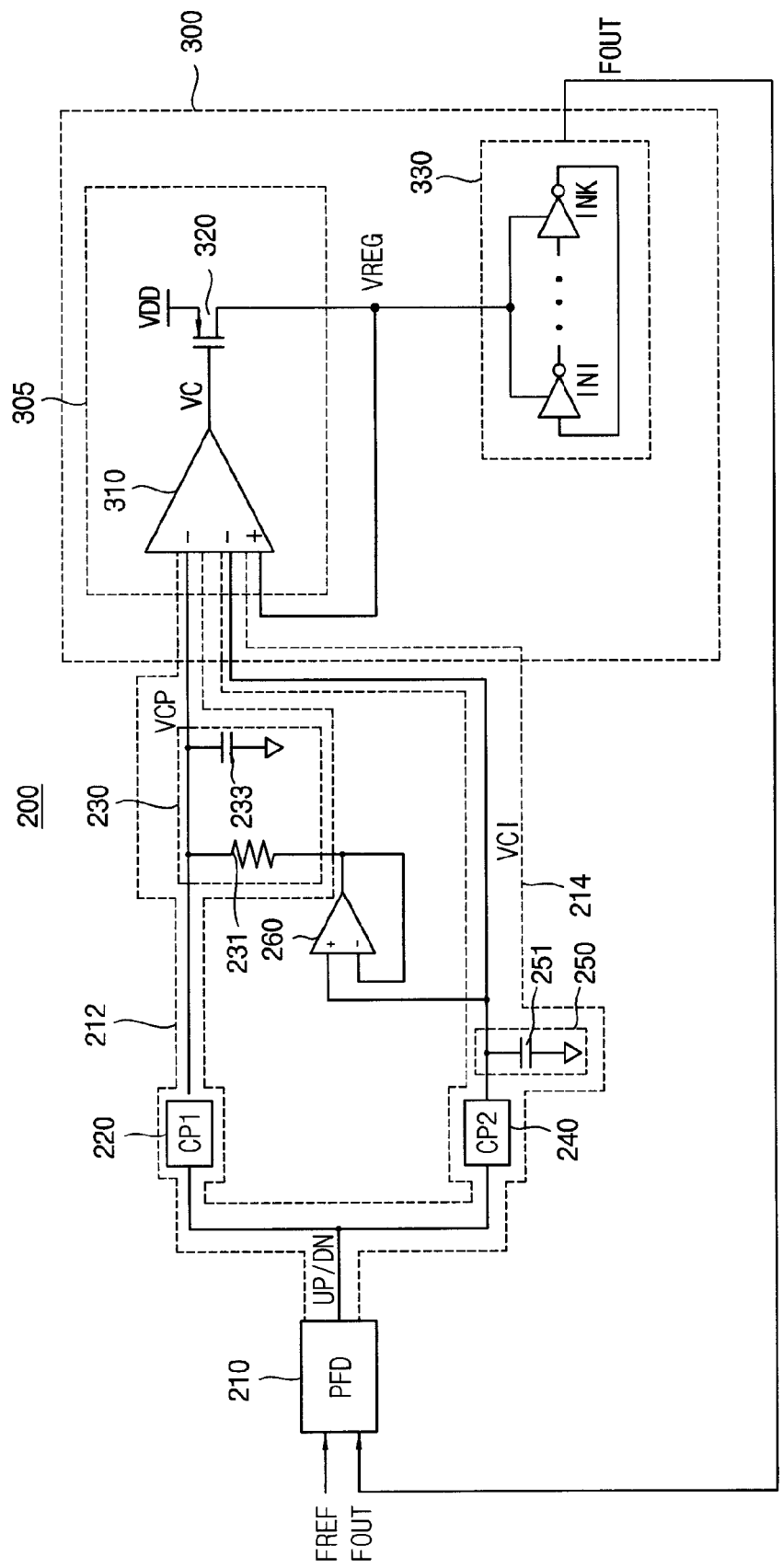
FIG. 3 is a circuit diagram illustrating a PLL circuit, according to some example embodiments.

FIG. 3 is a circuit diagram illustrating a PLL circuit according to some example embodiments.

Referring to FIG. 3, a PLL circuit 200 according to some example embodiments includes a phase/frequency detector 210, a first signal path 212, a second signal path 214, and a VCO 300.

The phase/frequency detector 210 generates an up/down signal UP/DN based on an input signal, i.e., a reference signal FREF, and an output signal FOUT. The first signal path 212 provides a first oscillation control signal VCP proportional to the up/down signal UP/DN to the VCO 300. The second signal path 214 provides a second oscillation control signal VCI represented by an integral function of the up/down signal UP/DN to the VCO 300. The VCO 300 independently receives the first oscillation control signal VCP and the second oscillation control signal VCI to generate the output signal FOUT having a varying frequency in response to a regulated voltage signal VREG which is represented by a regular ratio of a combination of the first and second oscillation control signals VCP and VCI.

The first signal path 212 may include a first charge pump 220 and a first loop filter 230. The second signal path may include a second charge pump 240 and a second loop filter 250. The first charge pump 220 generates a first voltage signal varying in response to the up/down signal UP/DN. The first loop filter 230 filters the first voltage signal to provide the first oscillation control signal VCP. The first loop filter 230 may include a resistor 231 and a first capacitor 233. Since the first loop filter 230 includes the resistor 231 and the first capacitor 233, the first signal path 212 provides the first oscillation control signal VCP proportional to the up/down signal UP/DN to the VCO 300.

The second charge pump 240 generates a second voltage signal varying in response to the up/down signal UP/DN. The second loop filter 250 filters the second voltage signal to provide the second oscillation signal VCI. The second loop filter 250 may include a second capacitor 251. Since the second loop filter 250 only includes the second capacitor 251, the second signal path 220 provides the second oscillation control signal VCI which is represented by an integral function of the up/down signal UP/DN to the VCO 300.

The PLL circuit 200 may further include a buffer 260 coupled between the first loop filter 230 and the second loop filter 250. The buffer 260 has a unity gain, and maintains DC voltage levels of the first and second oscillation control signal VCP and VCI. Therefore, a voltage level of the regulated voltage signal VREG is maintained at a fixed level without fluctuation.

The VCO 300 includes a voltage regulator 305 and a delay unit 330. The voltage regulator 305 includes an amplifier 310 and a transistor 320, and the delay unit 330 includes a plurality of inverters IN1~INK. The VCO 300 independently receives the first oscillation control signal VCP and the second oscillation control signal VCI to provide the regulated voltage signal VREG, and the regulated voltage signal VREG is fed back to the VCO 300 as the VCO of FIG. 1.

The amplifier 310 receives the first oscillation control signal VCP, the second oscillation control signal VCI and the fed back regulated voltage signal VREG to provide a voltage control signal VC. The transistor 320 is coupled to a power supply voltage VDD, and provides the regulated voltage signal VREG to the delay unit 330 in response to the voltage control signal VC. The delay unit 330 receives the regulated voltage signal VREG to generate an output signal FOUT having a frequency varying according to a voltage level of the regulated voltage signal VREG.

Figure 4:
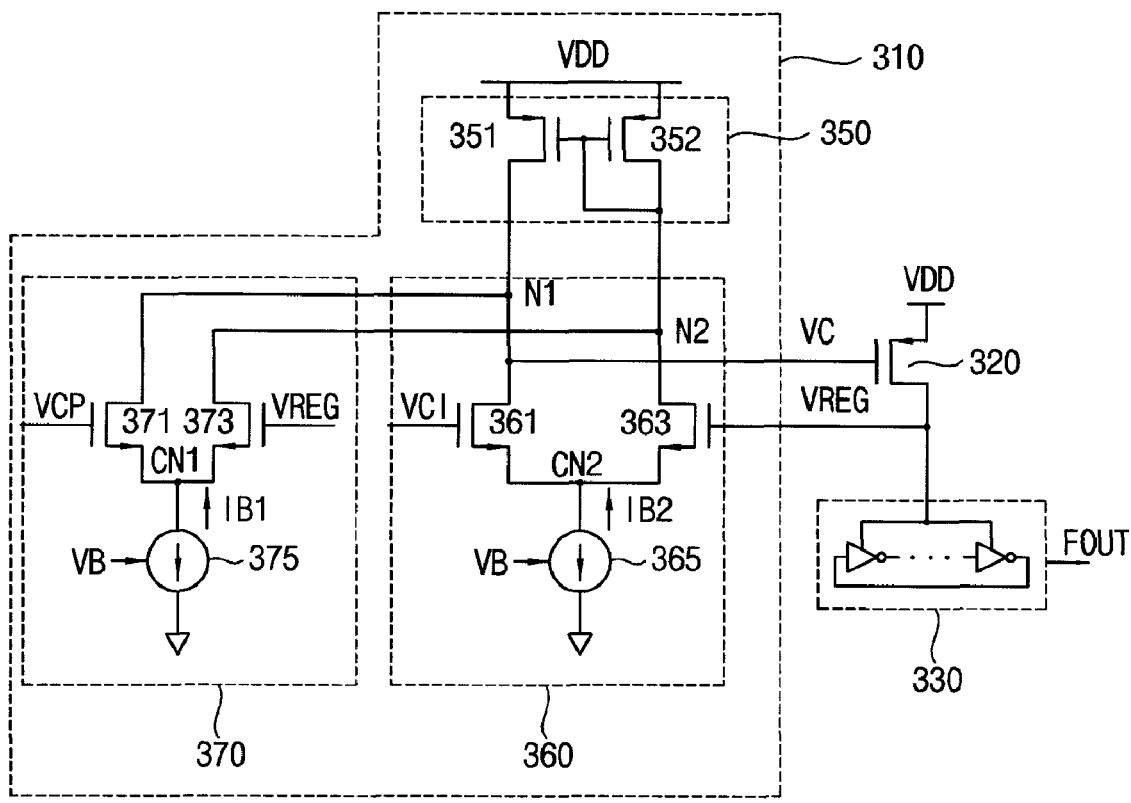
FIG. 4 is a circuit diagram illustrating the amplifier of FIG. 1 in detail, according to some example embodiments.

FIG. 4 is a circuit diagram illustrating the amplifier of FIG. 1 in detail according to some example embodiments.

Referring to FIG. 4, the amplifier 310 includes a current mirror unit 350, a first input unit 370, and a second input unit 360.

Figure 5:
FIG. 5 illustrates the currents sources of FIG. 4, according to some example embodiments.

The current mirror unit 350 includes PMOS transistors 351 and 352 coupled to the power supply voltage VDD. The first input unit 370 is coupled to the current mirror unit 350 at first and second nodes N1 and N2, and includes first and second NMOS transistors 371 and 373, and a first current source 375. The second input unit 360 is coupled to the current mirror unit 350 at the first and second nodes N1 and N2, and includes third and fourth NMOS transistors 361 and 363 and a second current source 365. As illustrated in FIG. 5, the first and second current sources 375 and 365 may be respectively implemented with NMOS transistors 376 and 366. The first current source 375 provides a first bias current IB1 to a first common node CN1 in response to a bias voltage VB. The second current source 365 provides a second bias current IB2 to a second common node CN2 in response to the bias voltage VB. As described in detail with reference to FIG. 2, each magnitude of the first and second bias current IB1 and IB2 is determined based on each of the sizes of the NMOS transistors 376 and 366. Therefore, the first contribution factor of the first oscillation control signal VCP and the second contribution factor of the second oscillation control signal VCI may be controlled by controlling sizes of the NMOS transistors 376 and 366 in the PLL circuit according to some example embodiments. In addition, the first contribution factor and the second contribution factor may be controlled by controlling relative sizes of the NMOS transistors 371, 373, and 376 to sizes of the NMOS transistors 361, 363 and 366.

Therefore, the VCO 300 independently receives the first oscillation control signal VCP and the second oscillation control signal VCI which are provided from different paths, and the contribution factor of the first oscillation control signal VCP with respect to regulated voltage signal VREG applied to the delay unit 330, and the contribution factor of the second oscillation control signal VCI with respect to the regulated voltage signal VREG applied to the delay unit 330 are controlled by the ratio of the magnitude of the bias current or by the ratio of the sizes of the transistors included in each of the input units. Accordingly, a gain of the VCO 300 may be controlled by individually controlling a first gain due to the first oscillation control signal VCP and a second gain due to the second oscillation control signal VCI, and thus the gain of the VCO may be reduced, and a jitter characteristic may be enhanced.

The amplifier of FIG. 3 may be implemented in various configurations.

Figure 6:
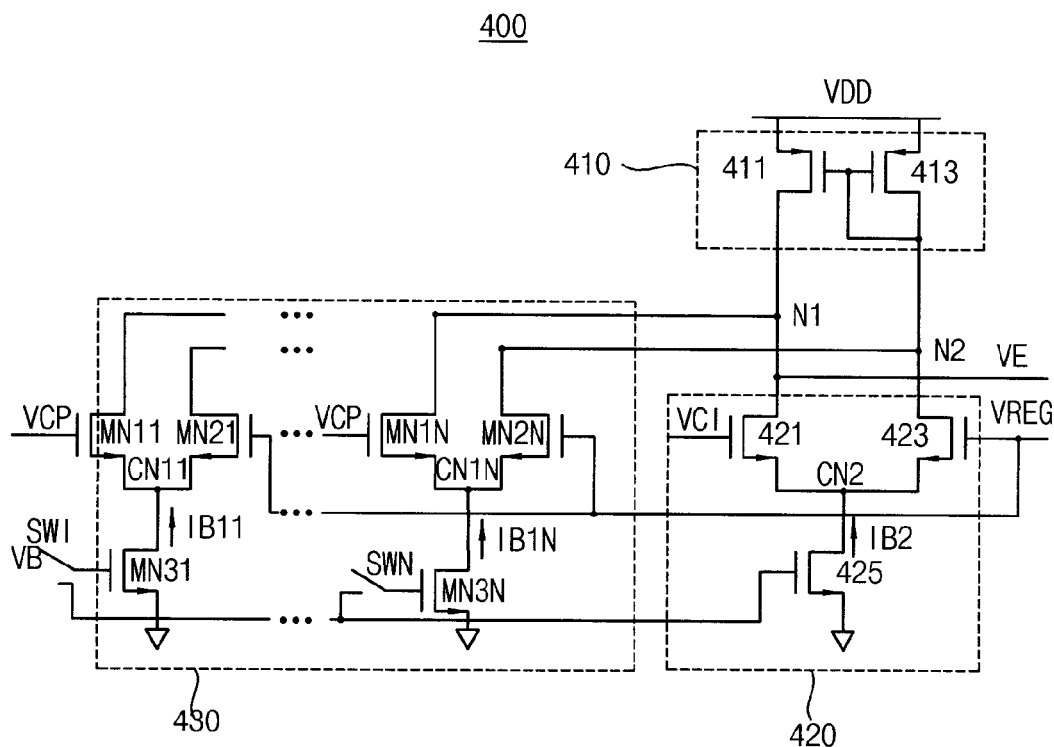
FIG. 6 is a circuit diagram illustrating an amplifier of FIG. 3, according to other example embodiments.

FIG. 6 is a circuit diagram illustrating an amplifier of FIG. 3 according to other example embodiments.

Referring to FIG. 6, an amplifier 400 includes a current mirror unit 410, a first input unit 430, and a second input unit 420 similarly with the amplifier 310 of FIG. 4. However, the amplifier 400 differs from the amplifier 310 in a configuration of the first input unit 430.

The current mirror unit 410 includes PMOS transistors 411 and 413 coupled to the power supply voltage VDD.

The first input unit includes a first plurality of NMOS transistors MN11, ..., MN1N, a second plurality of NMOS transistors MN21, ..., MN2N, and a third plurality of NMOS transistors MN31, ..., MN3N. Each of the first NMOS transistors MN11, ..., MN1N has a drain coupled to the first node N1, and a gate which receives the first oscillation control signal VCP. Each of the second NMOS transistors MN21, ..., MN2N has a drain coupled to the second node N2, and a gate which receives the regulated voltage VREG. Each of the third NMOS transistors MN31, ..., MN3N is commonly coupled to sources of the first and second NMOS transistors MN11, ..., MN1N and MN21, ..., MN2N at each of first common nodes CN11, ..., CN1N, and selectively provides a first plurality of bias currents IB11, ..., IB1N to each of the first common nodes CN11, ..., CN1N in response to the bias voltage VB applied to each of the third NMOS transistors MN31, ..., MN3N. The bias voltage VB may be selectively applied to each of the third NMOS transistors MN31, ..., MN3N in response to a plurality of switching control signals applied to a plurality of switches SW1, ..., SWN.

The second input unit 420 is coupled to the current mirror unit 410 at the first and second nodes N1 and N2, and includes fourth through sixth NMOS transistors 421, 423, and 425. The fourth NMOS transistor 421 has a drain coupled to the first node N1, and a gate receiving the second oscillation control signal VCI. The fifth NMOS transistor 423 has a drain coupled to the second node N2, and a gate receiving the regulated voltage signal VREG. The sixth NMOS transistor 425 has a drain commonly coupled to sources of the fourth and fifth NMOS transistors 421 and 423 at a second common node CN2, a gate receiving the bias voltage VB to provide a second bias current IB2 to the second common node CN2, and a source coupled to ground. The sixth NMOS transistor 425 operates as a second current source, and a magnitude of the second bias current IB2 is determined based on a size of the sixth NMOS transistor 425, i.e., a ratio of channel width to channel length of the sixth NMOS transistor 425.

Each size of the first NMOS transistors MN11, ..., MN1N may increase in the same proportion as the magnitudes of the first bias currents IB11, ..., IB1N. Each size of the second NMOS transistors MN21, ..., MN2N may increase in the same proportion as the magnitudes of the first bias currents IB11, ..., IB1N. In addition, Each size of the third NMOS transistors MN31, ..., MN3N may increase in the same proportion as the magnitudes of the first bias currents IB11, ..., IB1N. For example, the first NMOS transistors MN11, ..., MN1N and the second NMOS transistors MN21, ..., MN2N coupled to each of the first common nodes CN11, ..., CN1N, may have same sizes by the transistors coupled to each of the first common nodes CN11, ..., CN1N. That is, each size of the first NMOS transistors MN11, ..., MN1N and each size of the second NMOS transistors MN21, ..., MN2N coupled to each of the first common nodes CN11, ..., CN1N may respectively substantially correspond to Wn1, 2*Wn1, ..., $2^{N-1}$*Wn1. In addition, each size of the third NMOS transistors may respectively substantially correspond to Wn0, 2*Wn, ..., $2^{N-1}$*Wn0. Here, N is a natural number not less than two. Each size of the fourth and fifth NMOS transistors 421 and 423 may substantially correspond to M*Wn1, and a size of the sixth NMOS transistors 425 may substantially correspond to M*Wn0. Here, M is a natural number greater than N.

When sizes of the transistors included in the first and second input units 430 and 420 are implemented as described above, the contribution factor of the first oscillation control signal VCP with respect to regulated voltage signal VREG and the contribution factor of the second oscillation control signal VCI with respect to the regulated voltage signal VREG may be controlled in various combinations such as $2^N$ combinations. Therefore, the gain of the VCO 300 may correspond to $2^N$ combinations of a first gain due to the first oscillation control signal VCP and a second gain due to the second oscillation control signal VCI, and thus the gain of the VCO may be reduced, and a jitter characteristic may be enhanced.

In an example embodiment of FIG. 6, the transistors included in the first input unit 430 have sizes which increase in a fixed proportion. However, in another example embodiment, the transistors included in the second input unit 420 may have sizes which increase in a fixed proportion, and both of the transistors in the first and second input unit 430 and 420 may have sizes which increase in a fixed proportion.

Figure 7A:
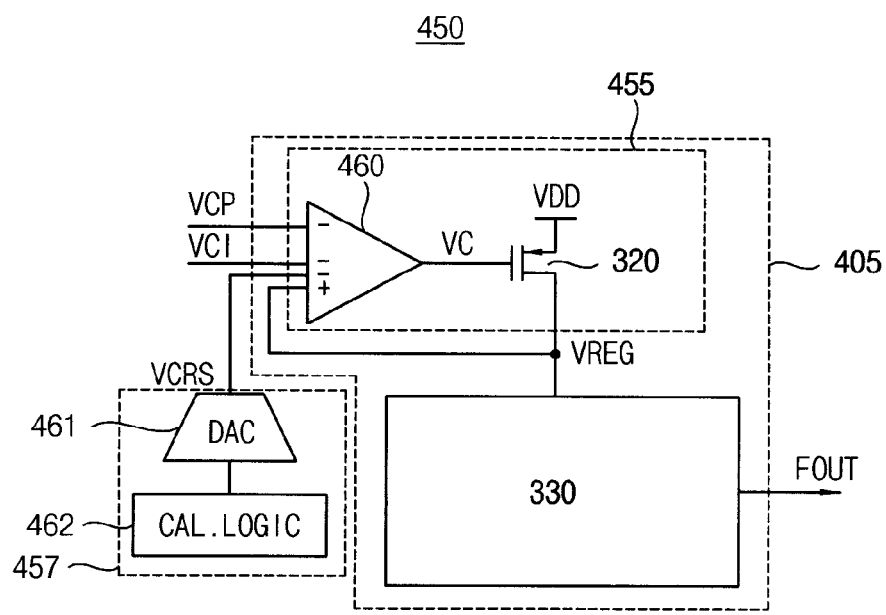
FIG. 7A is a circuit diagram illustrating a portion of a PLL circuit, according to other example embodiments.

FIG. 7A is a circuit diagram illustrating a portion of a PLL circuit according to other example embodiments.

A PLL circuit 450 of FIG. 7A further includes a control unit 457, and the PLL circuit 450 includes a VCO 405 of a different configuration when compared with the PLL circuit 200 of FIG. 3.

Figure 7B:
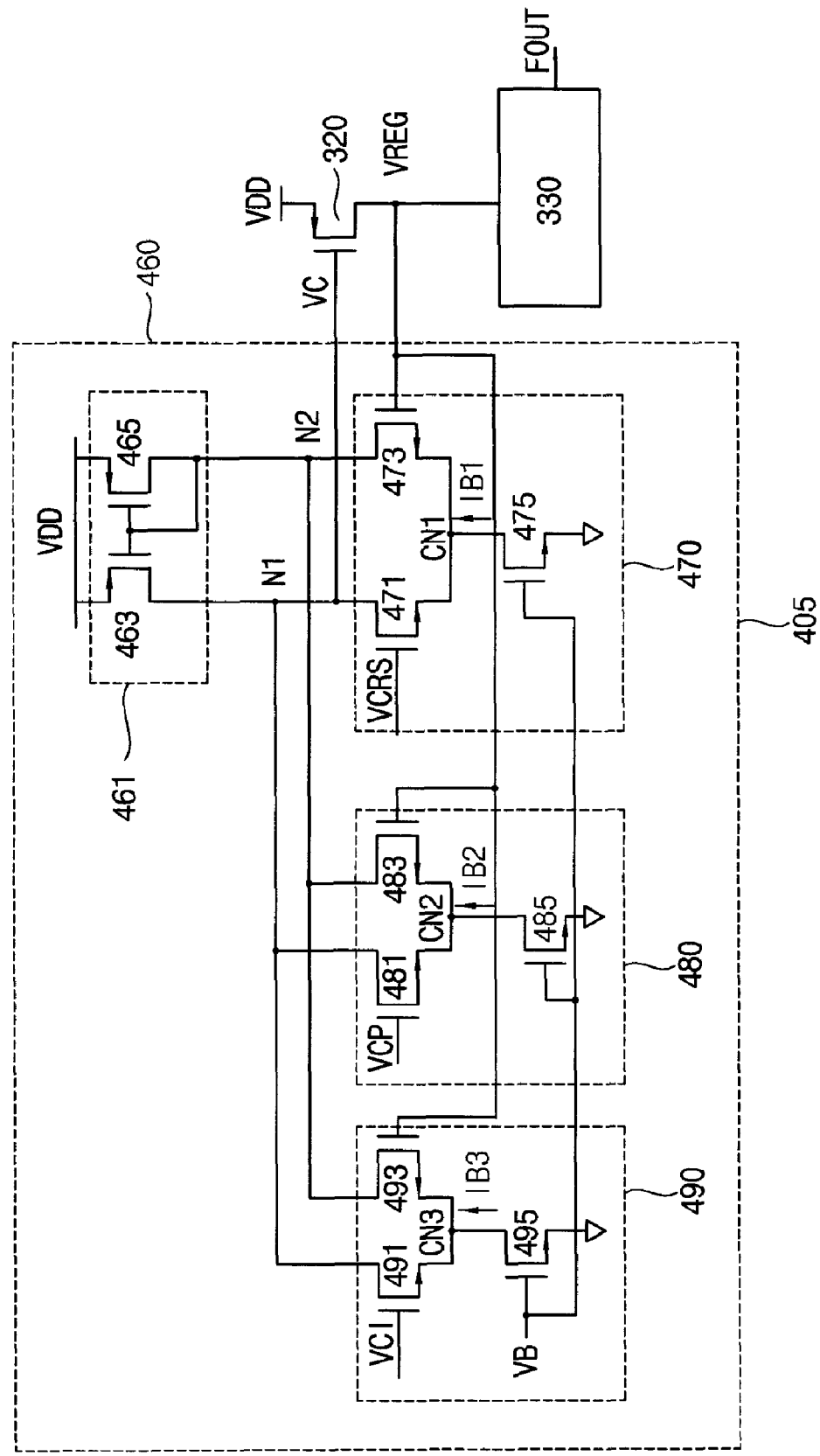
FIG. 7B is a circuit diagram illustrating a VCO in detail, according to some example embodiments.

FIG. 7B is a circuit diagram illustrating the VCO 405 in detail according to some example embodiments.

Hereinafter, the PLL circuit 450 according to other example embodiments will be described in detail with reference to FIGS. 3, 7A and 7B.

The PLL circuit 450 includes the VCO 405, a phase/frequency detector 210, a first signal path 212, a second signal path 214, and the control unit 457.

The VCO 405 performs a coarse tuning in response to a first oscillation control signal VCI based on a digital control signal VCRS in a first operation mode, and performs a fine tuning in response to a second oscillation control signal VCP and a third oscillation control signal VCI in a second operation mode to generate an output signal FOUT following a reference signal FREF. The phase/frequency 210 generates an up/down signal UP/DN based a phase difference of the reference signal FREF and the output signal FOUT. The first signal path 212 provides the second oscillation control signal VCP proportional to the up/down signal UP/DN to the VCO 405. The second signal path 214 provides the third oscillation control signal VCI represented by an integral function of the up/down signal UP/DN to the VCO 405. The control unit 457 provides the first oscillation control signal VCRS to the VCO 405. The PLL circuit 450 according to other example embodiments controls the regulated voltage signal VREG with the first oscillation control signal VCRS in the first operation mode in which the PLL does not operate, and controls the regulated voltage VREG based on the second oscillation control signal VCP and the third oscillation control signal VCI in the second operation mode in which the PLL is operating. Therefore, the gain of the VCO 405 may be reduced, because the first oscillation signal VCRS in the first operation mode is responsible for some part of the overall gain of the VCO 405.

Referring now to FIG. 7A, the control unit 457 includes a calibration logic circuit 462, and a digital to analog converter 461. The calibration logic circuit 462 provides the digital control signal having bits according to a target frequency of the output signal FOUT. The digital to analog converter 461 converts the digital control signal to provide the first oscillation control signal VCRS.

Referring to FIGS. 7A and 7B, the VCO 405 includes a voltage regulator 455 and a delay unit 330. The voltage regulator 455 includes an amplifier 455 and a transistor 320. The voltage regulator 155 generates a regulated voltage signal VREG based on the first oscillation control signal VCRS in the first operation mode and based on the second and third oscillation control signals VCP and VCI in the second operation mode, and the regulated voltage signal VREG follows the first oscillation control signal VCRS in the first operation mode, and the regulated voltage signal VREG is represented by a regular ratio of a combination of the second and third oscillation control signals VCP and VCI in the second operation mode, and the regulated voltage signal VREG is feedback to the voltage regulator 455. The delay unit 330 receives the regulated voltage signal VREG to generate the output signal FOUT having a frequency varying according to a voltage level of the regulated voltage signal VREG.

The voltage regulator 455 includes the amplifier 460 and the transistor 320. The amplifier 460 provides a voltage control VC signal based on the first oscillation control signal VCRS in the first operation mode, and based on the second oscillation control signal VCP, the third oscillation control signal VCI and the regulated voltage signal VREG in the second operation mode. The transistor 320 is coupled to the power supply voltage VDD, and provides the regulated voltage signal VREG to the delay unit 330 in response to the voltage control signal VC.

Referring now to FIG. 7B, the amplifier 460 includes a current mirror unit 461, a first input unit 470, a second input unit 480, and a third input unit 490. The current mirror unit 461 includes PMOS transistors 463 and 465 coupled to the power supply voltage VDD. The PMOS transistors 463 and 465 are coupled to each other in a mirror configuration.

The first input unit 470 is coupled to the current mirror unit 461 at first and second nodes N1 and N2, and includes first through third NMOS transistors 471, 473, and 475. The first NMOS transistor 471 has a drain coupled to the first node N1, and a gate receiving the first oscillation control signal VCRS. The second NMOS transistor 473 has a drain coupled to the second node N2, and a gate receiving the regulated voltage signal VREG. The third NMOS transistor 475 has a drain commonly coupled to sources of the first and second NMOS transistors 471 and 473 at a first common node CN1, a gate receiving a bias voltage VB to provide a first bias current IB1 to the first common node CN1, and a source coupled to the ground. The third NMOS transistor 475 operates as a first current source, and a magnitude of the first bias current IB1 is determined based on a size of the third NMOS transistor 475, i.e., a ratio of channel width to channel length of the third NMOS transistor 475.

The second input unit 480 is coupled to the current mirror unit 461 at the first and second nodes N1 and N2, and includes fourth through sixth NMOS transistors 481, 483, and 485.

The fourth NMOS transistor 481 has a drain coupled to the first node N1, and a gate receiving the second oscillation control signal VCP. The fifth NMOS transistor 483 has a drain coupled to the second node N2, and a gate receiving the regulated voltage signal VREG. The sixth NMOS transistor 485 has a drain commonly coupled to sources of the third and fourth NMOS transistors 481 and 483 at a second common node CN2, a gate receiving the bias voltage VB to provide a second bias current IB2 to the second common node CN1, and a source coupled to the ground. The sixth NMOS transistor 485 operates as a second current source, and a magnitude of the second bias current IB2 is determined based on a size of the sixth NMOS transistor 485, i.e., a ratio of channel width to channel length of the sixth NMOS transistor 485.

The third input unit 490 is coupled to the current mirror unit 461 at the first and second nodes N1 and N2, and includes seventh through ninth NMOS transistors 491, 493, and 495. The seventh NMOS transistor 491 has a drain coupled to the first node N1, and a gate receiving the third oscillation control signal VCI. The eighth NMOS transistor 493 has a drain coupled to the second node N2, and a gate receiving the regulated voltage signal VREG. The ninth NMOS transistor 495 has a drain commonly coupled to sources of the seventh and eighth NMOS transistors 491 and 493 at a third common node CN3, a gate receiving the bias voltage VB to provide a third bias current IB3 to the third common node CN3, and a source coupled to the ground. The ninth NMOS transistor 495 operates as a third current source, and a magnitude of the third bias current IB3 is determined based on a size of the ninth NMOS transistor 495, i.e., a ratio of channel width to channel length of the ninth NMOS transistor 495.

The first input unit 470 provides voltage control signal VC in the first operation mode. The second input unit 480 controls the first contribution factor of the second oscillation control signal VCP with respect to the regulated voltage signal VREG in the second operation mode. The third input unit 490 controls the second contribution factor of the third oscillation control signal VCI with respect to the regulated voltage signal VREG in the second operation mode.

Similarly with the description with reference to FIGS. 2 and 4, a voltage level of the voltage control signal VC in the first operation mode and the first and second contribution factor in the second operation mode may be controlled by controlling sizes of the transistors 475, 485, and 495 operating as current sources. In addition, the voltage level of the voltage control signal VC in the first operation mode and the first and second contribution factor in the second operation mode may be controlled by controlling sizes of the transistors included in the first through third input units 470, 480 and 490. For example, when each size of the NMOS transistors 481, 483 and 485 substantially corresponds to Wn1, Wn1 and Wn0, each size of the NMOS transistors 491, 493, and 495 of the third input unit 490 may substantially correspond to N*Wn1, N*Wn1, and N*Wn0, and each size of the NMOS transistors 481, 483, and 485 of the second input unit 480 may substantially correspond to M*Wn1, M*Wn1, and M*Wn0. Here, 1<N<M. When the sizes of the transistors of FIG. 7B are implemented described above, most of the target frequency of the output signal FOUT is tuned by the first oscillation control signal VCRS in the first operation mode. In the second operation mode, the rest of the target frequency of the output signal FOUT is tuned by the second oscillation control signal VCP and the third oscillation control signal VCI with the ratio of 1:N, and thus, thus the gain of the VCO 405 may be significantly reduced, and a jitter characteristic may be enhanced.

Figure 8A:
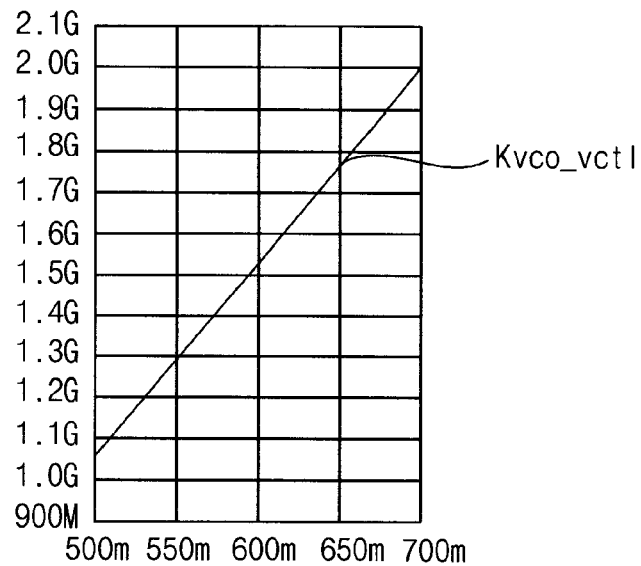
FIGS. 8A and 8B are simulation diagram comparing the gain of the VCO according to some example embodiments.
Figure 8B:
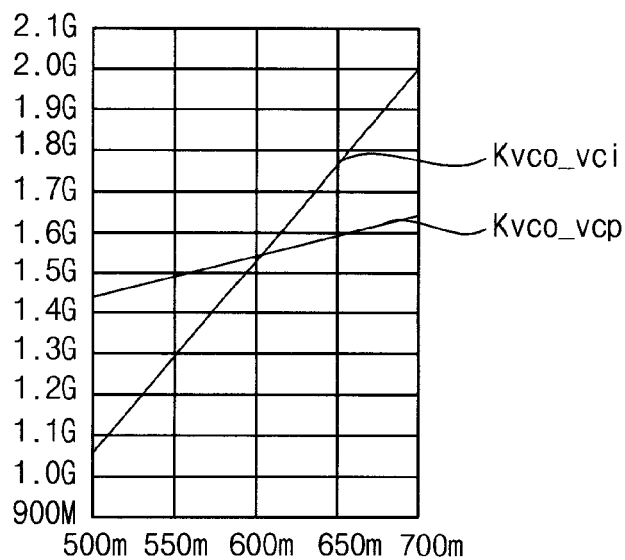

FIGS. 8A and 8B are simulation diagram comparing the gain of the VCO according to some example embodiments.

FIG. 8B illustrates a V(voltage)-F(frequency) curve of VCO of FIGS. 3 through 5 according to some example embodiments, and FIG. 8A illustrates a V-F curve of VCO FIGS. 3 through 5, when the VCO 300 receives only one oscillation control signal, that is only one signal path is included. In FIGS. 8A and 8B, transistor included in the first and second input units 360 and 370 have size ratio 1:4.

Referring to FIGS. 8A and 8B, when one signal path is included, the gain of the VCO(Kvco_vctl) is about 4.6 GHz/V, when two signal paths are included, the first gain of the VCO (Kvco_vcp) due to the first oscillation control signal VCP is about 0.91 GHz/V, and the second gain of the VCO (Kvco_vci) due to the second oscillation control signal VCI is about 3.7 GHz/V. Here, the relationship of Kvco_vctl, Kvco_vcp and Kvco_vci is represented by [Equation 2] below.

$$Kvco\_vctl = Kvco\_vcp/5 + 4*Kvco\_vci/5. \qquad \text{Equation 2}$$

Therefore, it is noted that an effective gain of the VCO is reduced by ⅕.

The PLL circuits of FIGS. 2 and 7A, the output signal FOUT is divided by a frequency divider, and the divided output signal FOUT may be applied to the phase/frequency detector.

The PLL circuits according to example embodiments may be employed in a clock generator.

Figure 9:
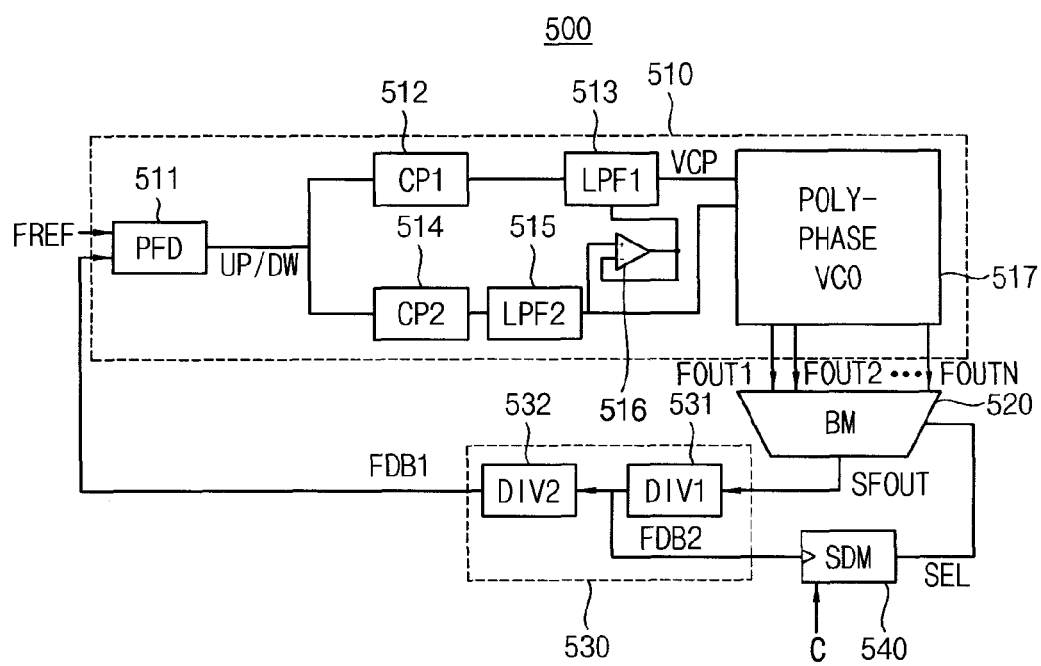
FIG. 9 is a block diagram illustrating a clock generator, according to some example embodiments.

FIG. 9 is a block diagram illustrating a clock generator according to some example embodiments.

Referring to FIG. 9, a clock generator 500 includes a PLL 510, a selection unit 520, a frequency dividing unit 530, and a sigma-delta modulator (SDM) 540.

The PLL 510 generates a plurality of output signals FOUT1, FOUT2, ..., FOUTN having fixed phase differences from a reference signal FREF. The selection unit 520 selects one of the output signals FOUT1, FOUT2, ..., FOUTN and outputs the selected output signal SFOUT, in response to a plurality of selection signals SEL. In addition, the selection unit 520 prevents simultaneous transitions of at least two adjacent selection signals of the plurality of selection signals SEL, which will be described later. The frequency dividing unit 530 divides a frequency of the selected output signal SFOUT to provide a first feedback signal FDB1 to the PLL 510. The SDM 540 operates in synchronization with a second feedback signal FDB2 having a frequency which is R times a frequency of the reference signal, and generates the selection signals SEL in response to a control signal C. Here, R is a natural number.

In the clock generator 500 of FIG. 9, the selection unit 520 may sequentially select the output signals FOUT1, FOUT2, ..., FOUTN by selecting one of the output signals FOUT1, FOUT2, ..., FOUTN with a higher frequency than a frequency of the reference signal FREF.

Figure 10A:
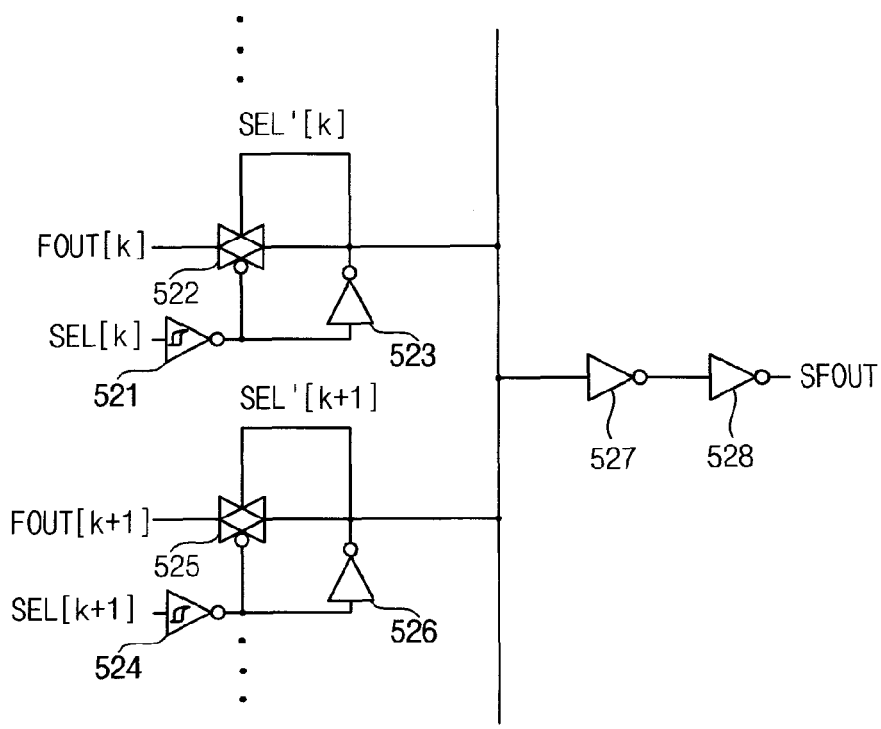
FIG. 10A illustrates a portion of a selection unit, according to some example embodiments.

FIG. 10A illustrates a portion of the selection unit 520.

Referring to FIG. 10A, the selection unit 520 includes Schmitt Trigger circuits 521 and 524, transmission gates 522 and 525, and inverters 523, 526, 527 and 528. Each of the Schmitt Trigger circuits 521 and 524 may be a half Schmitt Trigger circuit. In FIG. 10A, two adjacent output signals FOUT[k] and FOUT[k+1], and two adjacent selection signals SEL[k] and SEL[k+1] are illustrated. Two adjacent selection signals SEL[k] and SEL[k+1] are passed through the Schmitt Trigger circuits 521 and 524, and the inverters 523 and 526 to be intermediate selection signals SEL'[k] and SEL'[k+1]. The intermediate selection signals SEL'[k] and SEL'[k+1] and the selection signals SEL[k] and SEL[k+1] are applied to the transmission gates 522 and 525, the output signals FOUT[k] and FOUT[k+1] pass through the inverters 527, and 528 to be the selected output signal SFOUT. Therefore, the output signals FOUT1, FOUT2, . . . , FOUTN may be provided as the selected output signal SFOUT seamlessly, because the intermediate selection signals SEL'[k] and SEL'[k+1] have interval during which the intermediate selection signals SEL'[k] and SEL'[k+1] are simultaneously active in case the selection signals SEL[k] and SEL[k+1] transition simultaneously.

Figure 10B:
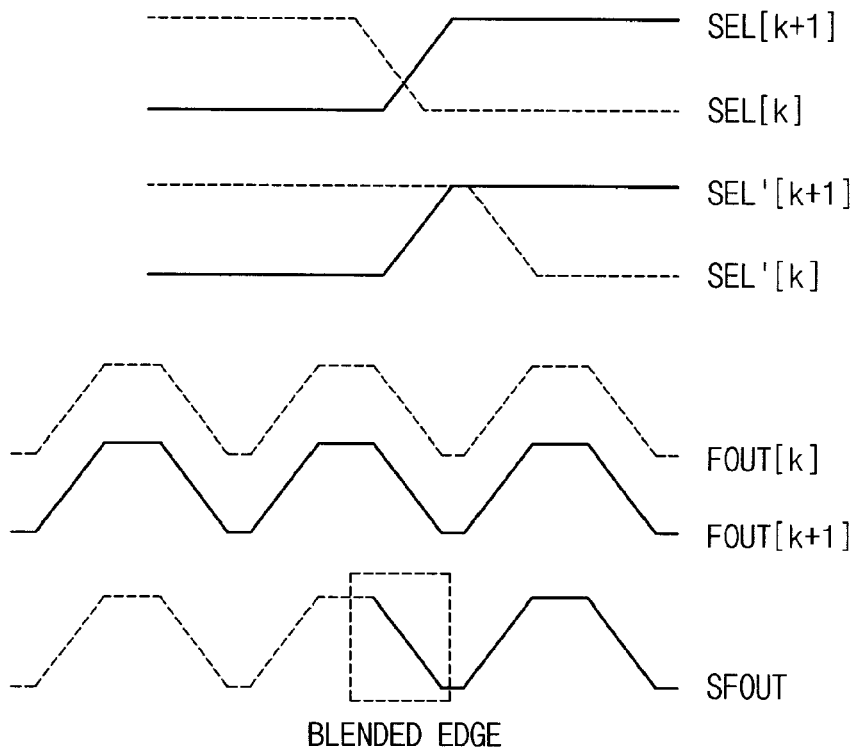
FIG. 10B is a timing diagram illustrating operation of the selection unit, according to some example embodiments.

FIG. 10B is a timing diagram illustrating operation of the selection unit 520.

Referring to FIG. 10B, it is noted that the output signals FOUT1, FOUT2, . . . , FOUTN may be provided as the selected output signal SFOUT seamlessly, because the intermediate selection signals SEL'[k] and SEL'[k+1] have interval during which the intermediate selection signals SEL'[k] and SEL'[k+1] are simultaneously active in case the selection signals SEL[k] and SEL[k+1] transition simultaneously.

Figure 11A:
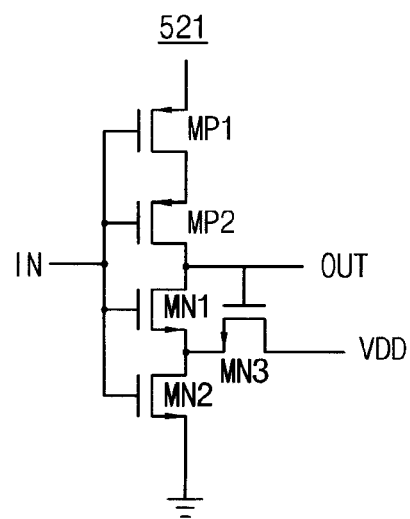
FIG. 11A is a circuit diagram illustrating a half Schmitt Trigger circuit.
Figure 11B:
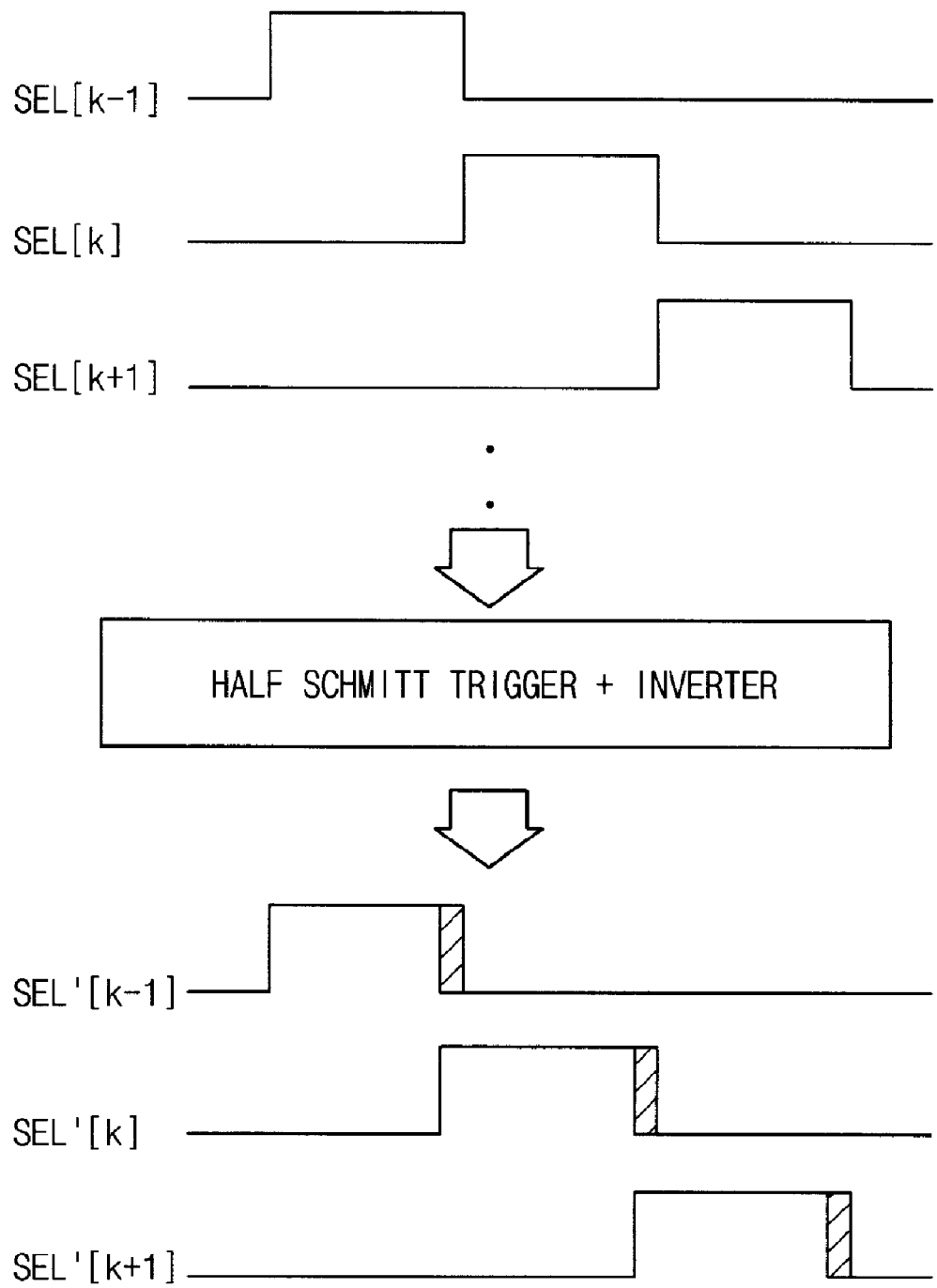
FIG. 11B is a timing diagram illustrating selection signals, according to some example embodiments.

FIG. 11A is a circuit diagram illustrating the half Schmitt Trigger circuit 521, and FIG. 11B is a timing diagram illustrating the selection signals.

Referring to FIG. 11A, the half Schmitt Trigger circuit 521 includes cascade-coupled PMOS transistors MP1 and MP2, and NMOS transistors MN1 and MN2, and a NMOS transistor MN3 coupled between the NMOS transistors MN1 and MN2 and a power supply voltage VDD. An input signal IN is applied to gates of the PMOS transistors MP1 and MP2, and NMOS transistors MN1 and MN2, and an output signal is provided at a connection point of the PMOS transistor MP2 and the NMOS transistor MN1, and the output signal OUT is applied to the gate of the NMOS transistor MN3.

Referring to FIG. 11B, the consecutive selection signals SEL[k−1], SEL[k], and SEL[k+1] pass through the half Schmitt Trigger circuit 521 and the inverter 523 to be the intermediate selection signals SEL'[k−1], SEL'[k], and SEL'[k+1], which do not transition simultaneously because of delay of the inverter 523. That is, in the clock generator 500 according to some example embodiments, the selection unit 520 may sequentially select the output signals FOUT1, FOUT2, . . . , FOUTN and provide the selected output signal SFOUT without seamless by using the half Schmitt Trigger circuit and the inverter. Therefore, the selection unit 520 may be referred to as a "blending multiplexer".

Referring again to FIG. 9, the frequency dividing unit 530 includes a first frequency divider 531, and a second frequency divider 532 that are connected in series for dividing a frequency of the selected output signal SFOUT. The first frequency divider 531 divide the frequency of the selected output signal SFOUT by a division ratio of M (where M may be a natural number), and the second frequency divider 532 divides an output signal of the first frequency divider 421 by a division ratio of R (where may be a natural number). The second feedback signal FDB 2 is the output signal of the first frequency divider 531. Thus, a division ratio of K of the frequency dividing unit 530 may be a product of R and M.

The SDM 540 operates in synchronization with the second feedback signal FDB2 which is the output signal of the second frequency divider 531. The frequency of the second feedback signal FDB2 may be R times the frequency of the first feedback signal FDB 1 applied to the phase/frequency detector 511. Because the first feedback signal FDB1 may be configured to have substantially the same phase as the reference signal FREF, the frequency of the second feedback signal FDB2 may be R times the frequency of the reference signal FREF. Therefore, the selection unit 520 may sequentially select the output signals FOUT1, FOUT2, . . . , FOUTN by selecting one of the output signals FOUT1, FOUT2, . . . , FOUTN with a higher frequency than a frequency of the reference signal FREF.

The clock generator 500 according to some example embodiments may be employed for generating various clock signals in a multimedia system such as a high definition multimedia interface (HDMI) transceiver.

FIG. 12 is a block diagram illustrating a system on chip (SoC) 600 including a HDMI transmitter (TX) physical layer (PHY) 605.

Referring to FIG. 12, a HDMI TX PHY 605 according to some example embodiments includes a pixel clock generator 610, a clock multiplication unit (CMU) 620, an alignment unit 630, and a serializer/driver 640.

The pixel clock generator 610 generates a pixel clock signal PIXEL CLOCK based on a reference clock signal CLKREF. The CMU 620 multiplies the pixel clock signal PIXEL CLOCK for increasing the frequency of the pixel clock signal PIXEL CLOCK to provide a transition minimized differential signaling (TMDS) clock signal TMDS CLOCK. The pixel clock signal PIXEL CLOCK is provided to a video processor 650, and the video processor 650 provides pixel data PIXEL DATA corresponding to image sources to a link layer 660 with a frequency of the pixel clock signal PIXEL CLOCK. The link layer 660 receives the pixel data PIXEL DATA and the TMDS clock signal TMDS CLOCK, encodes and packetizes the pixel data PIXEL DATA to provide a link data LINK data to the alignment unit 630 in synchronization with a link clock signal LINK CLOCK having a frequency not lower than the frequency of the TMDS clock signal TMDS CLOCK. Here, the link data LINK DATA is encoded and packetized from the pixel data PIXEL DATA. The alignment unit 630 aligns the received link data LINK DATA in synchronization with the TMDS clock signal TMDS CLOCK, and provides the aligned link data LINK DATA to the serializer/driver 640. The serializer/driver 640 receives the aligned link data LINK DATA and the TMDS clock signal TMDS CLOCK and serializes the aligned link data LINK DATA. The serializer/driver 640 transmits the serialized link data LINK DATA as the TMDS data TMDS DATA[2:0] over three channels and the TMDS clock signal TMDS CLOCK over one channel.

The pixel clock generator 610 may employ the clock generator 500 without modification. The CMU 620 may employ the clock generator 500 except the SDM 540. Therefore, the frequency of the TMDS clock signal TMDS CLOCK is higher than the frequency of the pixel clock signal PIXEL CLOCK. The configurations and operations of the pixel clock generator 610 and the CMU 620 are similar with a configuration and operation of the clock generator 500 of FIG. 9, and thus detailed description will be omitted.

Figure 13A:
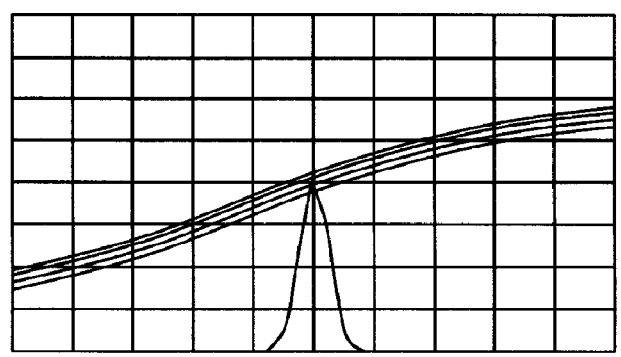
FIGS. 13A and 13B illustrate jitters of the TMDS clock signal and TMDS data of the HDMI TX PHY of FIG. 12, according to some example embodiments.
Figure 13B:
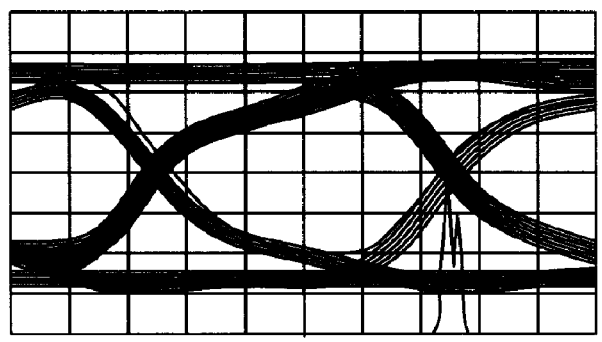

FIGS. 13A and 13B illustrate jitters of the TMDS clock signal and TMDS data of the HDMI TX PHY of FIG. 12.

FIGS. 13A and 13B illustrate jitters of the TMDS clock signal TMDS CLOCK and TMDS data TMDS DATA measured at transmission rate of 3.4 Gbps.

Referring to FIGS. 13A and 13B, a peak-to-peak to value of the jitter of the TMDS clock signal TMDS CLOCK is about 28 ps, and a peak-to-peak to value of the jitter of the TMDS data TMDS DATA is about 34 ps.

Figure 14A:
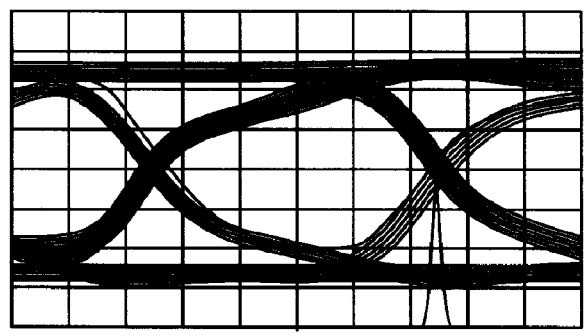
FIG. 14A illustrates an eye diagram of the TMDS data.
Figure 14B:
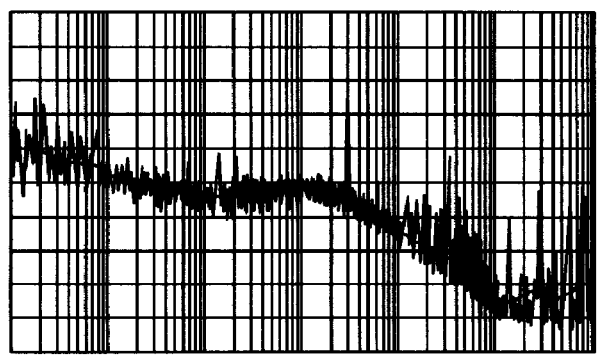
FIG. 14B illustrates a frequency of the TMDS clock signal, according to some example embodiments.

FIG. 14A illustrates an eye diagram of the TMDS data, and FIG. 14B illustrates a frequency of the TMDS clock signal.

FIG. 14A illustrates the eye diagram of the TMDS data TMDS DATA in 59.94 Hz mode, and FIG. 14B illustrates the frequency of the TMDS clock signal TMDS CLOCK synthesized at a frequency of about 297 MHz.

Referring to FIGS. 14A ad 14B, a mask touch does not occur in a compliance mask of the eye diagram of the TMDS data TMDS DATA, and a missing edge does not happen in the TMDS clock signal TMDS CLOCK.

According to some example embodiments, in the PLL, the jitter characteristic of the VCO may be enhanced by individually controlling the gain of the VCO by at least two oscillation control signals from different paths. In addition, in the HDMI TX PHY employing the PLL, the jitter characteristic may be enhanced, and he missing edge of the clock signals may be prevented because of the clock generator employs the blending multiplexer.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A voltage-controlled oscillator (VCO) comprising:
 a voltage regulator configured to independently receive a first oscillation control signal and a second oscillation control signal to provide a regulated voltage signal which is represented by a regular ratio of combination of the first and second oscillation control signals, the regulated voltage signal being fed back to the voltage regulator; and
 a delay unit configured to generate an output signal having a frequency varying in response to the regulated voltage signal,
 wherein the voltage regulator comprises an amplifier that provides a voltage control signal in response to the first oscillation control signal, the second oscillation control signal, and the regulated voltage signal, and
 wherein the amplifier comprises:
  a current mirror unit, coupled to a power supply voltage, which includes a first PMOS transistor and a second PMOS transistor;
  a first input unit, coupled to the current mirror unit at first and second nodes, configured to receive the first oscillation control signal, the regulated voltage signal and a bias voltage to control a first contribution factor of the first oscillation control signal with respect to the regulated voltage signal; and
  a second input unit, coupled to the current mirror unit at the first and second nodes, configured to receive the second oscillation control signal, the regulated voltage signal and the bias voltage to control a second contribution factor of the second oscillation control signal with respect to the regulated voltage signal, the voltage control signal being provided at the first node.

2. The VCO of claim 1, wherein the voltage regulator further comprises
 a transistor coupled to a power supply voltage, wherein the transistor is configured to provide the regulated voltage signal in response to the voltage control signal.

3. The VCO of claim 1, wherein the first input unit comprises:
 a first NMOS transistor having a drain coupled to the first node, and a gate which receives the first oscillation control signal;
 a second NMOS transistor having a drain coupled to the second node, and a gate which receives the regulated voltage; and
 a first current source including a third NMOS transistor, commonly coupled to sources of the first and second NMOS transistors at a first common node, which provides a first bias current of a first magnitude to the first common node in response to the bias voltage applied to a gate of the third NMOS transistor, and
 wherein the second input unit comprises:
 a fourth NMOS transistor having a drain coupled to the first node, and a gate which receives the second oscillation control signal;
 a fifth NMOS transistor having a drain coupled to the second node, and a gate which receives the regulated voltage; and
 a second current source including a sixth NMOS transistor, commonly coupled to sources of the fourth and fifth NMOS transistors at a second common node, which provides a second bias current of a second magnitude to the second common node in response to the bias voltage applied to a gate of the sixth NMOS transistor.

4. A phase-locked loop (PLL) circuit comprising:
 a phase/frequency detector configured to generate an up/down signal based on an input signal and an output signal;
 a first signal path that provides a first oscillation control signal proportional to the up/down signal;
 a second signal path that provides a second oscillation control signal represented by an integral function of the up/down signal; and
 a voltage-controlled oscillator (VCO) configured to independently receive the first oscillation control signal and the second oscillation control signal to generate the output signal having a varying frequency in response to a regulated voltage signal which is represented by a regular ratio of combination of the first and second oscillation control signals,
 wherein the VCO comprises a voltage regulator configured to independently receive the first oscillation control signal and the second oscillation control signal to provide the regulated voltage signal, the regulated voltage signal being fed back to the voltage regulator,
 wherein the voltage regulator comprises an amplifier that provides a voltage control signal in response to the first oscillation control signal, the second oscillation control signal, and the regulated voltage signal, and
 wherein the amplifier comprises:
  a current mirror unit, coupled to a power supply voltage, which includes a first PMOS transistor and a second PMOS transistor;
  a first input unit, coupled to the current mirror unit at first and second nodes, configured to receive the first oscillation control signal, the regulated voltage signal and a bias voltage to control a first contribution factor of the first oscillation control signal with respect to the regulated voltage signal; and
  a second input unit, coupled to the current mirror unit at the first and second nodes, configured to receive the second oscillation control signal, the regulated voltage signal and the bias voltage to control a second contribution factor of the second oscillation control signal with respect to the regulated voltage signal, the voltage control signal being provided at the first node.

5. The PLL circuit of claim 4,
wherein the first signal path includes:
a first charge pump that generates a first voltage signal varying in response to the up/down signal; and
a first loop filter that filters the first voltage signal to provide the first oscillation control signal, and
wherein the second signal path includes:
a second charge pump that generates a second voltage signal varying in response to the up/down signal; and
a second loop filter that filters the second voltage signal to provide the second oscillation control signal.

6. The PLL circuit of claim 4, further comprising:
a buffer, coupled between the first loop filter and the second loop filter, which maintains DC voltage levels of the first and second oscillation control signals.

7. The PLL circuit of claim 4, wherein the VCO further comprises
a delay unit configured to generate the output signal in response to the regulated voltage signal.

8. The PLL circuit of claim 4, wherein the voltage regulator further Comprises; and
a transistor coupled to a power supply voltage, wherein the transistor is configured to provide the regulated voltage signal in response to the voltage control signal.

9. The PLL circuit of claim 4,
wherein the first input unit comprises:
a first NMOS transistor having a drain coupled to the first node, and a gate which receives the first oscillation control signal;
a second NMOS transistor having a drain coupled to the second node, and a gate which receives the regulated voltage; and
a first current source including a third NMOS transistor, commonly coupled to sources of the first and second NMOS transistors at a first common node, which provides a first bias current of a first magnitude to the first common node in response to the bias voltage applied to a gate of the third NMOS transistor, and
wherein the second input unit comprises:
a fourth NMOS transistor having a drain coupled to the first node, and a gate which receives the second oscillation control signal;
a fifth NMOS transistor having a drain coupled to the second node, and a gate which receives the regulated voltage; and
a second current source including a sixth NMOS transistor, commonly coupled to sources of the fourth and fifth NMOS transistors at a second common node, which provides a second bias current of a second magnitude to the second common node in response to the bias voltage applied to a gate of the sixth NMOS transistor.

10. The PLL circuit of claim 9, wherein the first contribution factor is determined based on the first magnitude of the first bias current and the second contribution factor is determined based on the second magnitude of the second bias current.

11. The PLL circuit of claim 9, wherein the first contribution factor is determined based on sizes of the first and second NMOS transistors, and the second contribution factor is determined based on sizes of the fourth and fifth NMOS transistors.

12. The PLL circuit of claim 9, wherein the first contribution factor is determined based on sizes of the first, second and third NMOS transistors, and the second contribution factor is determined based on sizes of the fourth, fifth and sixth NMOS transistors.

13. The PLL circuit of claim 12, wherein when the first and second NMOS transistors have same sizes substantially corresponding to W0, each of the fourth and fifth NMOS transistors has size substantially corresponding to N*W0 (N is a natural number more than one), and wherein when the third NMOS transistor has a size substantially corresponding to W1, the sixth NMOS transistor has a size substantially corresponding to N*W1.

14. The PLL circuit of claim 13, wherein a relationship of the first oscillation control signal VCP, the second oscillation control signal VCI and the regulated voltage signal VERG is represented by:

$$VREG=VCP*1/(N+1)+VCI*N/(N+1).$$

* * * * *